US011251200B2

(12) United States Patent
Liebmann et al.

(10) Patent No.: US 11,251,200 B2
(45) Date of Patent: Feb. 15, 2022

(54) COAXIAL CONTACTS FOR 3D LOGIC AND MEMORY

(71) Applicant: Tokyo Electron Limited, Tokyo (JP)

(72) Inventors: Lars Liebmann, Mechanicville, NY (US); Jeffrey Smith, Clifton Park, NY (US); Anton J. deVilliers, Clifton Park, NY (US); Kandabara Tapily, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 140 days.

(21) Appl. No.: 16/716,901

(22) Filed: Dec. 17, 2019

(65) Prior Publication Data

US 2020/0373330 A1 Nov. 26, 2020

Related U.S. Application Data

(60) Provisional application No. 62/851,990, filed on May 23, 2019.

(51) Int. Cl.
*H01L 27/118* (2006.01)
*H01L 23/522* (2006.01)
(Continued)

(52) U.S. Cl.
CPC .. *H01L 27/11807* (2013.01); *H01L 21/76816* (2013.01); *H01L 23/5226* (2013.01);
(Continued)

(58) Field of Classification Search
CPC ........... H01L 23/49827; H01L 23/5384; H01L 2225/06548; H01L 21/76885; H01L 23/5226; H01L 23/528–5283
See application file for complete search history.

(56) References Cited

U.S. PATENT DOCUMENTS

2015/0011094 A1* 1/2015 Narishige ............. H01L 21/308
438/723
2015/0340371 A1* 11/2015 Lue .................. H01L 27/11582
257/324
(Continued)

OTHER PUBLICATIONS

International Search Report and Written Opinion dated Aug. 3, 2020 in PCT/US2020/025969, 11 pages.
(Continued)

*Primary Examiner* — Amar Movva
(74) *Attorney, Agent, or Firm* — Oblon, McClelland, Maier & Neustadt, L.L.P.

(57) ABSTRACT

A semiconductor device includes a coaxial contact that has conductive layers extending from local interconnects and being coupled to metal layers. The local interconnects are stacked over a substrate and extend laterally along a top surface of the substrate. The metal layers are stacked over the local interconnects and extend laterally along the top surface of the substrate. The conductive layers are close-shaped and concentrically arranged, where each of the local interconnects is coupled to a corresponding conductive layer, and each of the conductive layers is coupled to a corresponding metal layer. The semiconductor device also includes insulating layers that are close-shaped, concentrically arranged, and positioned alternately with respect to the conductive layers so that the conductive layers are spaced apart from one another by the insulating layers.

14 Claims, 15 Drawing Sheets

(51) Int. Cl.
*H01L 27/02* (2006.01)
*H01L 21/768* (2006.01)
*H01L 27/105* (2006.01)
*H01L 27/11* (2006.01)

(52) U.S. Cl.
CPC ...... *H01L 27/0207* (2013.01); *H01L 27/1052* (2013.01); *H01L 27/11* (2013.01); *H01L 2027/11861* (2013.01); *H01L 2027/11866* (2013.01); *H01L 2027/11875* (2013.01); *H01L 2027/11885* (2013.01)

(56) References Cited

U.S. PATENT DOCUMENTS

| | | | |
|---|---|---|---|
| 2017/0025431 A1* | 1/2017 | Kanakamedala | ... H01L 29/4234 |
| 2018/0122807 A1* | 5/2018 | Anderson | ....... H01L 21/823871 |

OTHER PUBLICATIONS

Mingyu Li et al., "Skybridge-3D-CMOS: A Fine-Grained 3D CMOS Integrated Circuit Technology", IEEE, 2017, pp. 1-15.

* cited by examiner

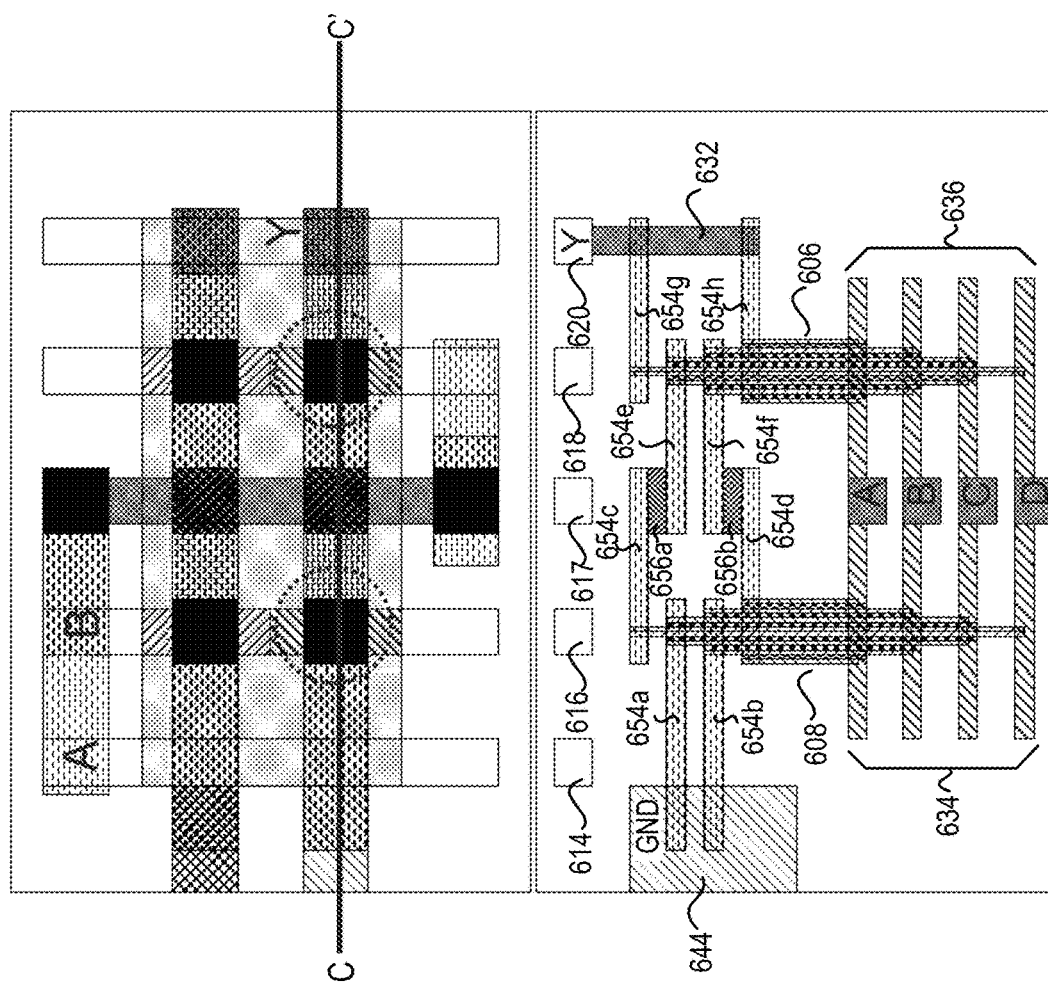

COAXIAL CONTACTS FOR 3D LOGIC AND MEMORY

CROSS REFERENCE TO RELATED APPLICATIONS

This application claims the benefit of U.S. Provisional Application No. 62/851,990 filed on May 23, 2019, the entire contents of which is incorporated herein by reference.

FIELD OF THE INVENTION

This disclosure relates to methods of microfabrication, including fabrication of semiconductor devices.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY 3D integration has been seen as the most viable option to continue semiconductor scaling in spite of inevitable saturation in critical dimension scaling. As a contacted gate pitch reaches its scaling limit due to manufacturing variability and electrostatic device limitations, two-dimensional transistor density scaling stops. Even experimental new transistor designs, such as vertical channel gate-all-around transistors, that may be able to one day overcome these contacted gate pitch scaling limits, do not promise to get semiconductor scaling back on track because resistance, capacitance, and reliability concerns prevent wire pitch scaling, thereby limiting the density with which transistors can be wired into circuits.

3D integration, i.e., the vertical stacking of multiple devices, aims to overcome these scaling limitations by increasing transistor density in volume rather than area. This idea has been successfully demonstrated and implemented by the flash memory industry with the adoption of 3D NAND. 3D integration of logic devices, however, has considerable challenges. One challenge to achieve scaling density in 3D integrated devices is a minimum pitch with which subsequent device levels can be contacted from the wiring levels above.

Techniques herein provide a coaxial contact (or coaxial contact structure) that selectively connects individual levels (e.g., source-side/drain-side local interconnects, gate electrodes) in a device-stack (also referred to transistor stack) to corresponding levels (e.g., metal layers, metal levels, M0 level, M1 level) in a wiring-stack without a need to stagger either level in a stair-cased formation. In addition to the structure of the coaxial contact, a manufacturing flow to build such a structure and a cell-architecture is also disclosed.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a semiconductor device is provided. The semiconductor device is formed over a substrate, and includes conductive layers. The conductive layers extend from local interconnects and are coupled to metal layers that are stacked over the local interconnects. The local interconnects are stacked over the substrate and extend laterally along a top surface of the substrate. Moreover, the metal layers extend laterally along the top surface of the substrate. The conductive layers are close-shaped, concentrically arranged, and extend in a pillar shape, where each of the local interconnects is coupled to a corresponding conductive layer from the conductive layers, and each of the conductive layers is coupled to a corresponding metal layer from the metal layers. Further, the semiconductor device includes insulating layers. The insulating layers are close-shaped, concentrically arranged, and positioned alternately with respect to the conductive layers so that the conductive layers are spaced apart from one another by the insulating layers.

The conductive layers can have bottom ends, where the bottom ends are staggered and coupled to one or more of the local interconnects so that each of the local interconnects is coupled to a respective conductive layer from the conductive layers. The conductive layers can also have top ends, where the top ends are staggered and coupled to one or more of the metal layers so that each of the conductive layers is coupled to a respective metal layer from the metal layers.

In some embodiments, the conductive layers can have at least one of a tube configuration, or a cylinder configuration. The tube configuration or the cylinder configuration can have a tapered profile.

The semiconductor device can further have transistor pairs that are stacked over the substrate, where each of the transistor pairs includes a n-type transistor and a p-type transistor that are stacked over one another. The n-type transistor can have a source region and a drain region that are positioned at two ends of a n-type channel region of the n-type transistor. Each of the source region and drain region of the n-type transistor is coupled to a respective local interconnect. The n-type channel region is surrounded by a n-type gate structure. The p-type transistor can have a source region and a drain region that are positioned at two ends of a p-type channel region of the p-type transistor. Each of the source region and drain region of the p-type transistor is coupled to a respective local interconnect, and the p-type channel region is surrounded by a p-type gate structure.

The semiconductor device can also have gate electrodes that are stacked over the substrate. The gate electrodes can be electrically coupled to gate structures of the transistor pairs. At least one of the conductive layers extends from one of the gate electrodes, and is coupled to the one of the gate electrodes.

The insulating layers can have bottom ends and top ends. The bottom ends are staggered so that a bottom end of each of the insulating layers is level with a bottom end of a corresponding conductive layer from the conductive layers. The insulating layers can also have top ends. The top ends are staggered so that a top end of each of the insulating layers is level with a top end of a corresponding conductive layer from the conductive layers.

According to another aspect of the disclosure, a method for forming a semiconductor device is provided. In the disclosed method, a first opening is formed in a dielectric stack that is positioned over a substrate. The first opening can have a cylinder shape with a first sidewall and a first bottom. A first conductive layer is subsequently deposited along the first sidewall of the first opening and a first insulating layer is deposited along an inner sidewall of the first conductive layer. The first conductive layer and the first insulating layer can be close-shaped and are concentrically arranged. A bottom of the first conductive layer and a bottom of the first dielectric layer are positioned on the first bottom of the first opening.

The dielectric stack is then etched along an inner sidewall of the first insulating layer so as to form a second opening. The second opening extends into the dielectric stack and has a second sidewall and a second bottom. The second sidewall is formed along the inner sidewall of the first dielectric layer and further extending into the dielectric stack. The second bottom of the second opening is positioned below the bottoms of the first conductive layer and first insulating layer. A second conductive layer is further formed along the second sidewall of the second opening and a second insulating layer is formed along an inner sidewall of the second conductive layer. A bottom of the second conductive layer and a bottom of the second insulating layer are positioned on the second bottom of the second opening so that the bottom of the second conductive layer is positioned below the bottom of the first conductive layer to form a staggered configuration.

In some embodiments, the disclosed method can further include alternately etching the dielectric stack and depositing a conductive layer and an insulating layer sequentially so that conductive layers and insulating layers are formed in the dielectric stack to meet a predefined number of conductive layers and a predefined depth. The conductive layers and the insulating layers are positioned alternately with a closed-shape and concentrically arranged. The first conductive layer is an outermost layer of the conductive layers. The conductive layers have bottom ends, where the bottom ends are staggered and coupled to one or more of local interconnects so that each of the local interconnect is coupled to a respective conductive layer. The local interconnects are stacked over the substrate and extend laterally along a top surface of the substrate.

The method can further include depositing a dielectric capping layer over the insulating layers, the conductive layers and the dielectric stack, where the insulating layers, the conductive layers and the dielectric stack are coplanar. The method then includes performing a first vertical etch into the dielectric stack to form a vertical trench opening around an outer sidewall of the first conductive layer, where the vertical trench opening extends into the dielectric stack with a first depth and uncover a first portion of the first conductive layer.

A first lateral etch is then performed to remove the uncovered first portion of the first conductive layer and a first portion of the first insulating layer that is adjacent to the uncovered first portion of the first conductive layer, where the first lateral etch further uncovers a first portion of the second conductive layer. A second vertical etch is then performed into the dielectric stack to extend the vertical trench opening into the dielectric stack with a second depth and uncover a second portion of the first conductive layer. The method subsequently includes performing a second lateral etch, where the second lateral etch removes (i) the uncovered second portion of the first conductive layer and a second portion of the first insulating layer that is adjacent to the uncovered second portion of the first conductive layer, so as to uncover a second portion of the second conductive layer; and (ii) the uncovered first portion of the second conductive layer and a first portion of the second insulating layer that is adjacent to the uncovered first portion of the second conductive layer, so as to uncover a first portion of a third conductive layer of the conductive layers, where the third conductive layer is formed along an inner sidewall of the second insulating layer.

The method can further include alternately performing a vertical etch and a lateral etch so that each of the conductive layers is uncovered in the vertical trench opening, and top ends of the conductive layers are staggered and coupled to one or more of metal layers. Accordingly, each of the conductive layers is coupled to a respective metal layer, where the metal layers are stacked over the local interconnects.

According to yet another aspect of the disclosure, a semiconductor device is provided. The semiconductor device includes transistor pairs that are stacked over a substrate. Each of the transistor pairs can include a n-type transistor and a p-type transistor that are stacked over one another. The semiconductor device also includes local interconnects that are stacked over the substrate and extend along a top surface of the substrate. The local interconnects are electrically coupled to source regions and drain regions of the transistor pairs.

The semiconductor device further includes metal layers stacked over the local interconnects, and conductive layers. The conductive layers extend from the local interconnects and coupled to the metal layers. The conductive layers are cl ose-shaped and concentrically arranged. Each of the local interconnects is coupled to a corresponding conductive layer from the conductive layers, and each of the conductive layers is coupled to a corresponding metal layer from the metal layers. The semiconductor device can have insulating layers that are close-shaped, concentrically arranged, and positioned alternately with respect to the conductive layers so that the conductive layers are spaced apart from one another by the insulation layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6C is a third cross-sectional layout view of an AOI22 cell implemented based on a CFET stack and coaxial contacts, in accordance with some embodiments.

DETAILED DESCRIPTION

Figure 1A:
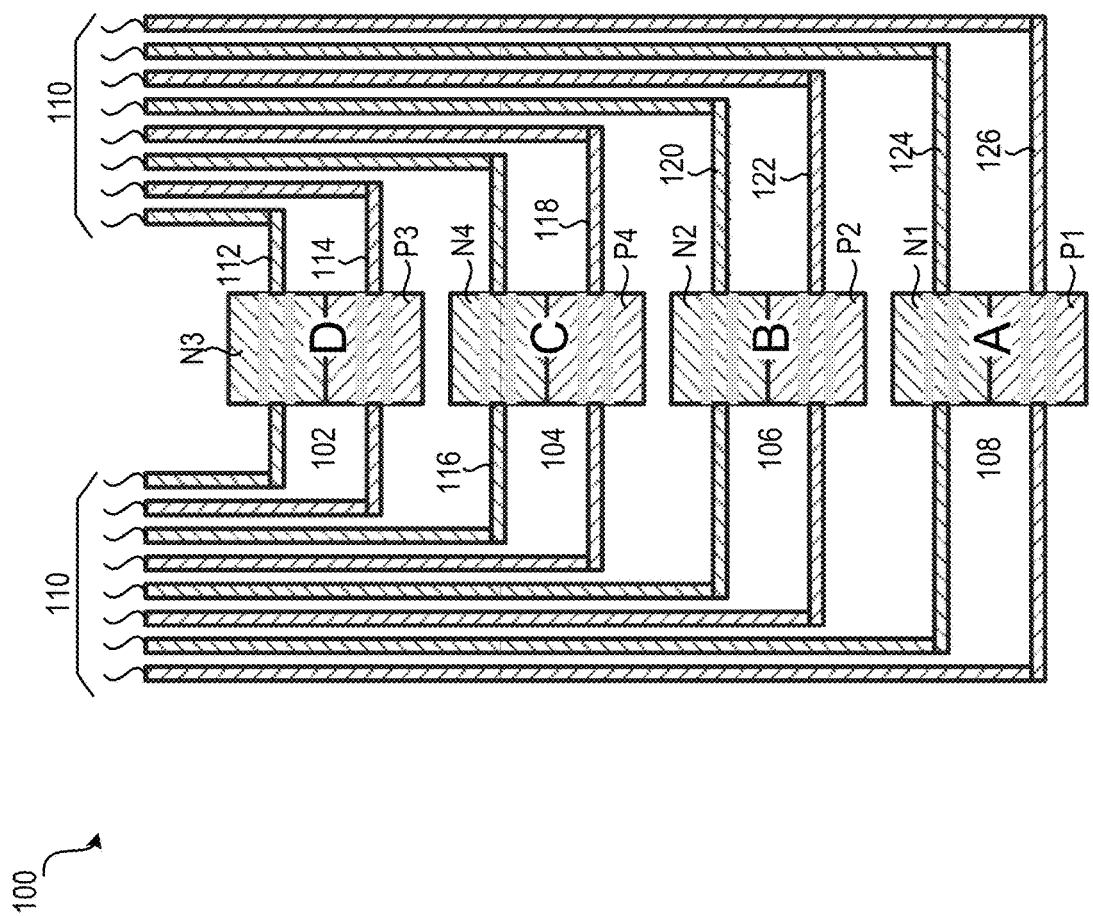
FIG. 1A is a schematic diagram of a related semiconductor device that is formed based on a 3D integrated CFET stack with stair-cased local interconnects, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

Figure 1B:
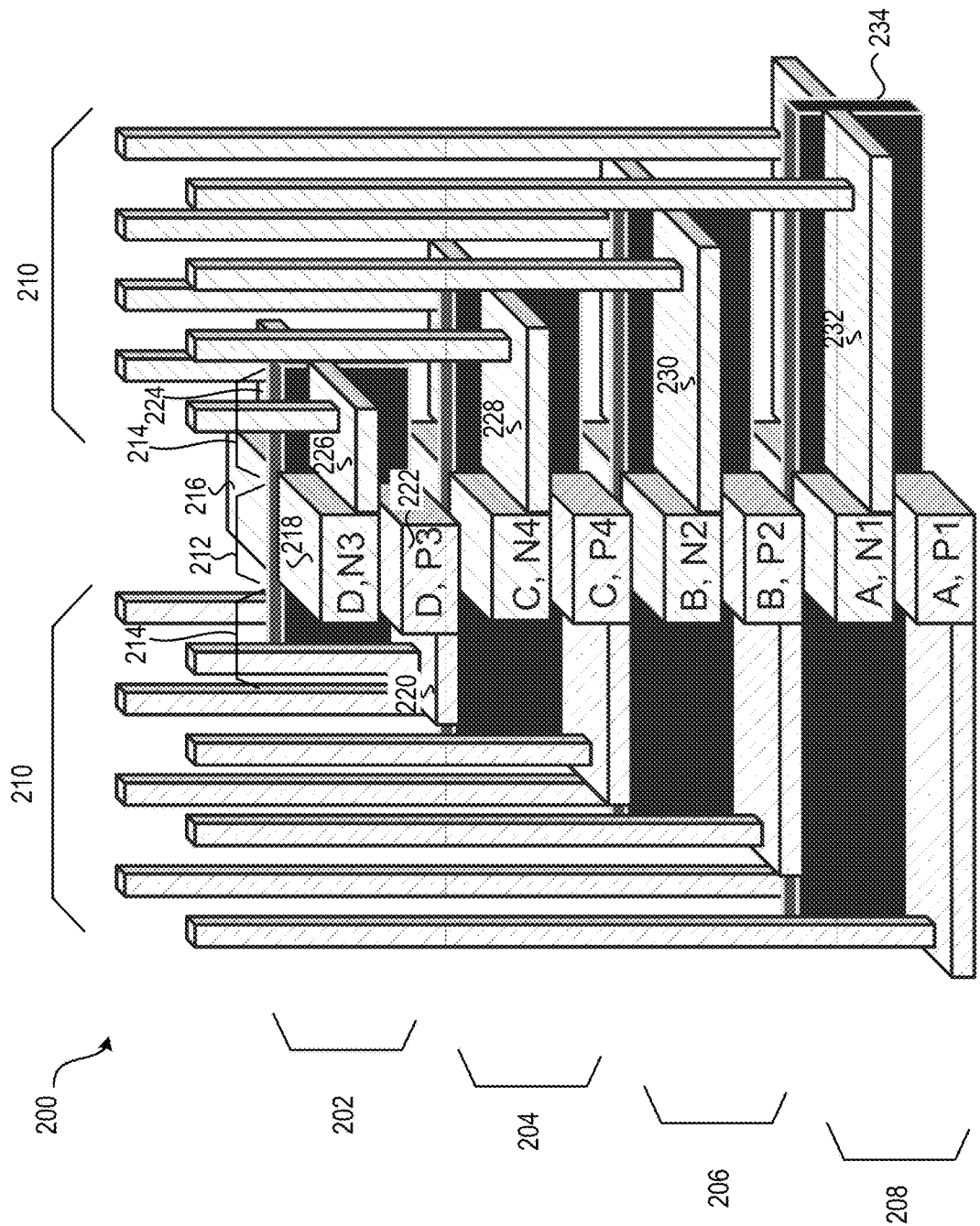
FIG. 1B is a schematic view of a related semiconductor device that is formed based on a 3D integrated CFET stack with stair-cased local interconnects, in accordance with some embodiments.

Some conventional semiconductor structures, such as those formed in the microfabrication of 3D NAND, for example, use stair-cased geometry. Stair-cased or step-shaped levels (e.g., word lines, local interconnects) connect to corresponding stair-cased/step-shaped wiring levels (e.g., metal 0 level, metal 1 level) to route stacked device layers to corresponding input and output signals. An adaptation of this stair-casing approach for 3D logic is shown in FIGS. 1A and 1B. FIG. 1A is a simplified cross-section of a substrate segment having a stack of four device layers and showing lateral local interconnects. Vertical contacts land on local interconnects to connect devices to access-pin positioned above a device stack. As shown in FIG. 1A, a 3D integrated complementary field effect transistor (CFET) stack 100 (also referred to as transistor stack 100, CFET stack 100, or CFET transistor stack 100) with stair-cased local interconnects is provided. The transistor stack 100 can include four CFET devices 102-108 that are stacked over a substrate (not shown). Each of the CFET devices can include a n-type transistor and p-type transistor that are coupled to a respective input (e.g., inputs A-D). For example, the CFET 102 can include the n-type transistor N3 and a p-type transistor P3. The transistor stack 100 can have a plurality of local interconnects 112-126 that have a staircase configuration. Each of the local interconnects is coupled to a respective transistor. The transistor stack 100 can further include a set of array of vertical contacts 110 that are coupled to and extend from the local interconnects 112-126. The set of array of vertical contacts 110 can have top surfaces in-plane with each other, while length of each vertical contact or column is different depending on a height and location of a landing step.

A poly gate runs through the stack left to right, with an active channel region in the middle. P and N local interconnects and vertical contacts are shown in FIG. 1B. FIG. 1B is an illustration of contacts landing on each of the local interconnects to contact subsequent source/drain regions from a given wiring level above. In other words, FIG. 1B shows an array of contacts landing on the stair-cased device stack. An achievable minimum size of an overall stacked device arrangement is ultimately limited by a required minimum landing area on each device level.

As shown in FIG. 1B, a semiconductor device can be formed based on a 3D integrated CFET stack 200 (also referred to as transistor stack 200, CFET stack 200, or CFET transistor stack 200) with stair-cased local interconnects. The CFET transistor stack 200 can include four CFET devices 202-208 that are stacked over a substrate (not shown). Each of the four CFET devices can include a transistor pair that is formed by a n-type transistor and a p-type transistor. For example, the CFET device 202 can include a transistor pair that is formed by the n-type transistor N3 and the p-type transistor P3. The n-type transistor can be positioned over the p-type transistor. In some embodiments, the n-type transistor and the p-type transistor can have a shared gate structure. The gate structure can surround a n-type channel region of the n-type transistor and a p-type channel region of the p-type transistor. The channel region can have a sheet, wire or bar configuration. The n-type transistor can have a source region and a drain region that are positioned at two ends of the n-type channel region respectively, where the gate structure surrounds the n-type channel region, and positioned between the source region and the drain region of the n-type transistor. The p-type transistor can have a source region and a drain region that are positioned at two ends of the p-type channel region respectively, where the gate structure surrounds the p-type channel region, and positioned between the source region and the drain region of the p-type transistor. Moreover, the gate structure can be electrically coupled to a gate electrode. The source region and the drain region can have a source local interconnect and a drain local interconnect respectively.

For example, the n-type transistor N3 and the p-type transistor P3 can have a shared gate structure 212. The n-type transistor N3 has a source region 218 and a drain region 216 that are position at two ends of the n-type channel region. The n-channel region is surrounded by the gate structure 212, where the gate structure 212 is positioned between the source region 218 and the drain region 216. The p-type transistor P3 has a source region 222 and a drain region behind the gate structure 212. The source region 222 and the drain region are positioned at two ends of the p-type channel region. Similarly, the p-type channel region is surrounded by the gate structure 212, where the gate structure 212 is positioned between the source region 222 and the drain region of the p-type transistor P3.

The gate structure 212 can have one or more gate electrodes 214. The gate electrodes 214 can be positioned at two ends of the gate structure 212. The source region 218 and the drain region 216 of the n-type transistor N3 can have a source local interconnect 226 and a drain local interconnect 224 respectively. Similarly, the source region 222 of the p-type transistor P3 can have a source local interconnect 220, and the drain region of the p-type transistor P3 can have a drain local interconnect positioned behind the gate structure 212. FIG. 1B also illustrates a plurality of local interconnects 228-232 that are coupled to n-type transistors N4, N2, N1 respectively.

It should be noted that the transistor stack 200 can further include a plurality of dielectric layers (not shown in FIG. 1B) that separate the transistor pairs from one another. The dielectric layers can also separate a n-type transistor and a p-type transistor from one another in a transistor pair. The dielectric layers can further separates the local interconnects (e.g., 220, 224-232 in FIG. 1B) from one another.

In the transistor stack 200, the gate electrodes and the source/drain (S/D) local interconnects (also referred to as source-side/drain-side local interconnects) can have a stair-case configuration. Further, a plurality of vertical contacts 210 are coupled to and extend from the S/D local interconnects or the gate electrodes. Therefore, the staircase configuration of the gate electrodes and the S/D local interconnects provides an easy access to each transistor in the transistor stack 200, and avoids a complicated interconnect connection.

Although FIGS. 1A and 1B provide configurations enabling an area-scaling and routing congestion improvement for logic standard cells as well as SRAM memory cells, an achievable minimum size of an overall stacked device arrangement is ultimately limited by a required minimum landing area on each device level. The minimum landing area of the local interconnects illustrated in FIGS. 1A and 1B driven primarily by two process constraints: lithographic resolution limit and lithographic placement limit. The lithographic resolution refers to a smallest pitch that can be patterned. Specifically, the lithographic resolution is the smallest pitch on which the contact array (e.g., 210 in FIG. 1B) can land, or each contact within the array can land. The smallest pitch is typically limited by resolution limits of a given photolithographic system (e.g., scanner or stepper) that is used to expose a pattern. The lithographic placement limit refers to additional space or tolerance needed to compensate for pattern placement errors. A misplaced pattern can cause shorting of contacts to local interconnect structures belonging to devices on adjacent device levels. In other words, despite capability of printing a small pattern, the pattern itself can be misaligned from a combination of tool and wafer factors.

To achieve higher levels of device integration, techniques herein provide a vertical coaxial interconnect structure that is able to selectively connect individual levels (e.g., local interconnects) in a device-stack to corresponding levels (e.g., M0 level, M1 level) in a wiring-stack without the need to stagger either level in a stair-cased formation. An exemplary structure is illustrated in FIG. 2, and an exemplary process flow is illustrated in FIGS. 3A-3H and FIGS. 4A-4I.

Figure 2:
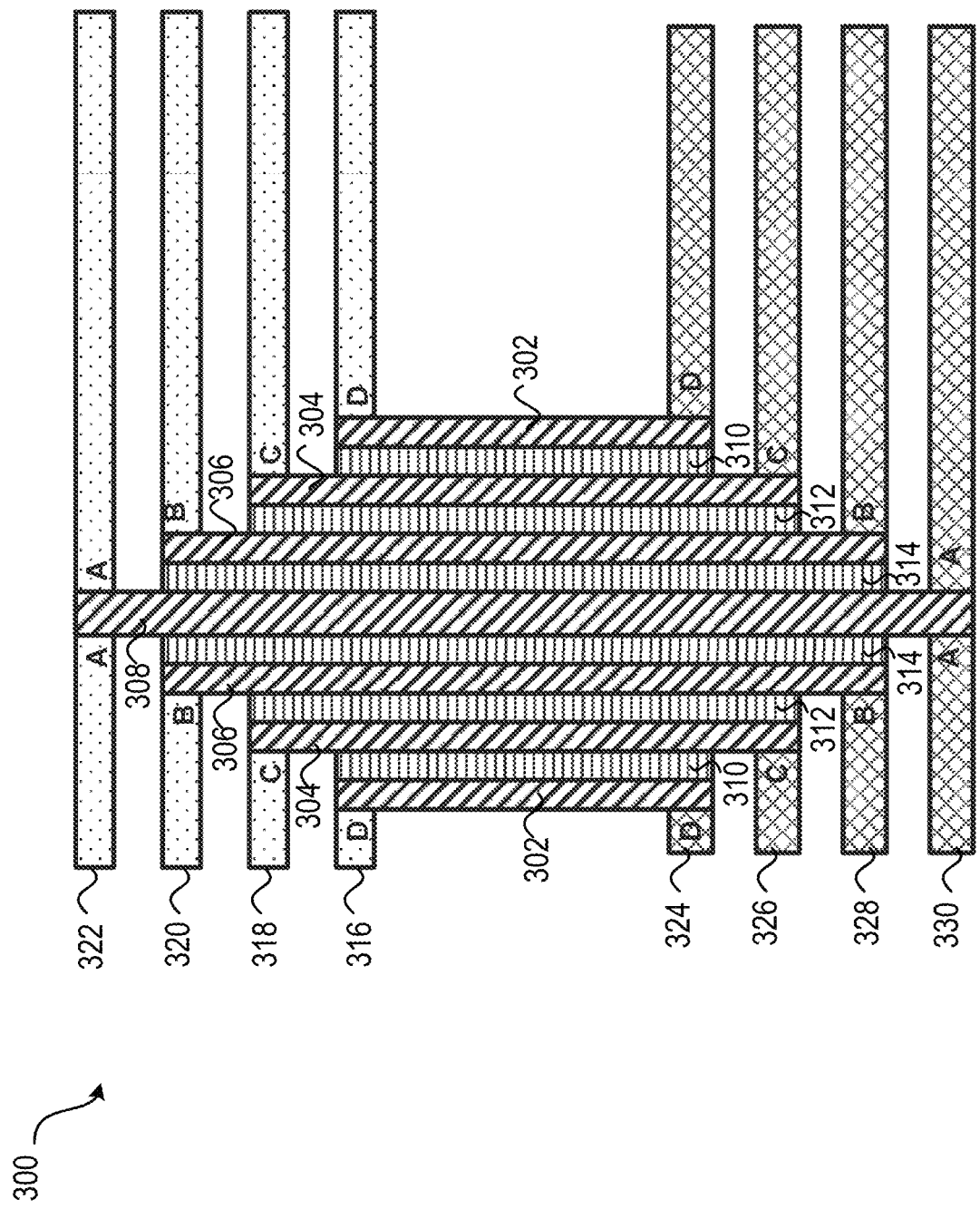
FIG. 2 is a schematic view of an exemplary coaxial contact, in accordance with some embodiments.

FIG. 2 is a schematic view of an exemplary coaxial contact (also referred to as coaxial contact structure, vertical coaxial contact, vertical coaxial contact structure, vertical coaxial interconnect structure) 300, in accordance with some embodiments. As shown in FIG. 2, a cross-section of the coaxial (or coax) contact 300 is shown that connects four levels of metal (also referred to as metal layers) 316-322 to four levels of local interconnect 324-330. The coaxial contact 300 can include a plurality of concentric layers of conductor (or conductive layers) 302-308 and insulator (or insulating layers) 310-314 forming tubes or cylinders in a 3D space. Both ends (i.e., bottom and top ends) of the coaxial contact are staggered to allow selective connection of sequential layers as indicated in labels A to D. For example, stair-cases in both levels (e.g., the local interconnects and the metal layers) to be connected from a conventional stair case are replaced by a set of concentric layers of conductors and insulators integrated into what is referred to herein as a coax contact (or coaxial contact). A staggered line-end configuration exposes sequential concentric "tubes" or cylinders of conductors in the coax contact to subsequent levels of metal or local-interconnect in stacks being connected. For a particular level, the outer tube (e.g., 302) of the coaxial contact structure 300 connects to a current metal (e.g., 316) or local-interconnect level (e.g., 324) while the insulating layer (e.g., 310) protects the next conductor tube (e.g., 304) from shorting to this particular level (e.g., 316 or 324).

Still referring to FIG. 2, the conductive layers 302-308 can extend from the local interconnects 324-330 and coupled to the metal layers (or metal levels, or M0 levels) 316-322 that are stacked over the local interconnects 324-330. The local interconnects 324-330 are stacked over a substrate (not shown) and extend laterally along a top surface of the substrate. The metal layers 316-322 can also extend laterally along the top surface of the substrate. The conductive layers 302-308 can be close-shaped, concentrically arranged, and extend in a pillar shape. Each of the local interconnects 324-330 is coupled to a corresponding conductive layer from the conductive layers 302-308, and each of the conductive layers 302-308 is coupled to a corresponding metal layer from the metal layers 316-322. For example, the conductive layer 304 extends from the local interconnect 326 and coupled to the local interconnect 326 and the metal layer 318.

In some embodiments, the conductive layers are close-shaped so that cross-sections of the conductive layers 302-308 obtained along a direction parallel to the substrate can have a closed-loop configuration formed in a circular geometry. However, other geometries, such as square, octagonal, rectangle, oval, triangle, or any other geometric shapes can also be applied according to circuit designs.

In some embodiments, the conductive layers are close-shaped so that the conductive layers 302-308 can extend in the pillar shape, and the pillar shape can have a tube configuration, or a cylinder configuration. For example, the conductive layer 308 can have a cylinder configuration and the conductive layer 302 can have a tube configuration. In some embodiment, the tube configuration or the cylinder configuration can has a tapered profile, which means that critical dimensions (CDs) of the top ends of the conductive layers are larger than the CDs of the bottom ends of the conductive layers.

As shown in FIG. 2, the coaxial contact 300 can further include a plurality of insulating layers 310-314 that are close-shaped, concentrically arranged, and positioned alternately with respect to the conductive layers. Accordingly the conductive layers 302-308 are spaced apart from one another by the insulating layers 310-314. For example, the conductive layers 302 and 304 are separated by the insulating layer 310, where the insulating layer 310 surrounds the conductive layer 302 and the conductive layer 304 surrounds the insulating layer 310.

The conductive layers 302-308 can have bottom ends. The bottom ends are staggered and coupled to one or more of the local interconnects 324-330 so that each of the local interconnects 324-330 is coupled to a respective conductive layer from the conductive layers. For example, a bottom end of the conductive layer 302 and a bottom end of the conductive layer 304 have a staggered configuration. The conductive layer 302 is coupled to the local interconnect 324, and the conductive layer 304 is coupled to the local interconnect 326 respectively. The conductive layers 302-308 can have top ends. The top ends are staggered and coupled to one or more of the metal layers 316-322 so that each of conductive layers is coupled to a respective metal layer from the metal layers. For example, a top end of the conductive layer 302 and a top end of the conductive layer 304 have a staggered configuration. The conductive layer 302 is coupled to the metal layer 316, and the conductive layer 304 is coupled to the metal layer 318 respectively.

In some embodiments, the conductive layers can land on top surfaces of the local interconnects so that each of the conductive layer can form a surface contact with a corresponding local interconnect. In some embodiments, the conductive layers can extend through the local interconnects so that each of the conductive layers can form a surrounding contact with a corresponding local interconnect. Similarly, in an example, the conductive layers can be positioned beneath the metal layers so that each of the conductive layers can form a surface contact with a corresponding metal layer. In another example, the conductive layers can extend through the metal layers so that each of the conductive layers can form a surrounding contact with a corresponding metal layer. In an exemplary embodiment of FIG. 2, the conductive layers extend through the local interconnects at the bottom ends and extend through the metal layers at the top ends.

Still referring to FIG. 2, the insulating layers 310-314 can have bottom ends. The bottom ends are staggered so that a bottom end of each of the insulating layers can be level with a bottom end of a corresponding conductive layer from the conductive layers. The insulating layers can also have top ends. The top ends are staggered so that a top end of each of the insulating layers can be level with a top end of a corresponding conductive layer from the conductive layers. For example, the bottom end of insulating layer 310 and the bottom end of conductive layer 302 are coplanar, and the top end of insulating layer 310 and the top end of conductive layer 302 are coplanar.

It should be noted that FIG. 2 is merely an example. The coaxial contact 300 can include any number of conductive layers, and the conductive layers can further be coupled to one or more gate electrodes or other components. Further, the local interconnects and the metal layers can be coupled to a CFET transistor stack (not shown). The CFET transistor stack can have a similar configuration to the CFET stack 200. For example, similar to CFET stack 200 that is shown in FIG. 1B, the CFET transistor stack can have a plurality of transistor pairs that are stacked over the substrate. Each of the transistor pairs includes a n-type transistor and a p-type transistor that are stacked over one another. The n-type transistor has a source region and a drain region that are positioned at two ends of a n-type channel region of the n-type transistor. Each of the source region and drain region of the n-type transistor is coupled to a respective local interconnect. The n-type channel region is surrounded by a n-type gate structure. The p-type transistor can have a source region and a drain region that are positioned at two ends of a p-type channel region of the p-type transistor. Each of the source region and drain region of the p-type transistor can be coupled to a respective local interconnect. The p-type channel region is surrounded by a p-type gate structure. Further, a plurality of gate electrodes that are stacked over the substrate, and electrically coupled to gate structures of the transistor pairs, where at least one of the conductive layers extends from one of the gate electrodes, and is coupled to the one of the gate electrodes. Comparing to the local interconnects (e.g., 226-232) in FIG. 1B, the local interconnects (e.g., 324-330) and/or the metal layers (e.g., 316-322) in the present disclosure do not need a stair-cased configuration after the implementation of the coaxial contacts. Accordingly, the lithographic resolution limit and lithographic placement limit that are associated with the stair-cased configuration can be exceeded.

Figure 3A:
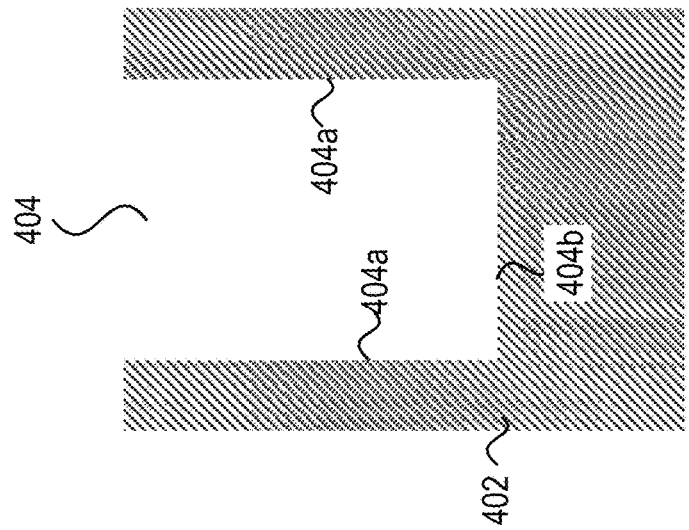
FIGS. 3A-3H are schematic views of first exemplary intermediate steps of manufacturing an exemplary coaxial contact, in accordance with some embodiments.
Figure 3B:
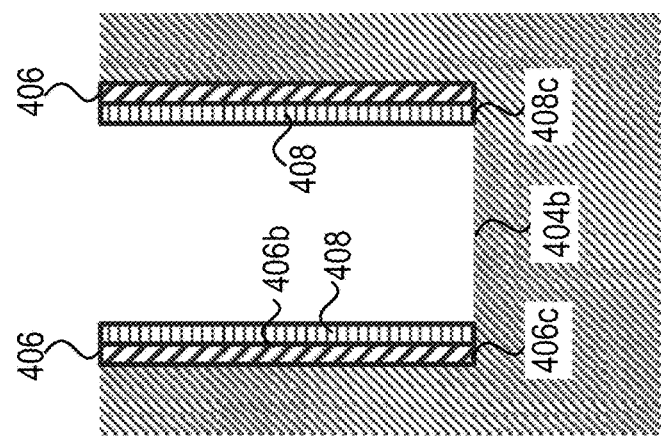

One process flow to build such a coaxial contact (or coaxial contact structure) is illustrated in FIGS. 3A-3H and FIGS. 4A-4I. FIGS. 3A-3H illustrate cross-sectional segments of formation of a coaxial contact structure to show bottom line-end stagger. That is, staggered reveal of each coaxial contact of a coaxial contact structure. In FIG. 3A, a first vertical etch is executed to define a first opening (form a hole) 404 within a dielectric stack 402 so that successive layers of the coaxial contact can be formed. The first opening 404 can have a first sidewall 404a and a first bottom 404b. In FIG. 3B, the initial vertical etch is followed by sidewall deposition of a conductor (or a first conductive layer) 406 and an insulator (or a first insulating layer) 408. The first conductive layer 406 is formed along the first sidewall 404a of the first opening 404 and the first insulating layer 408 is formed along an inner sidewall 406b of the first conductive layer 406. Accordingly, the first conductive layer 406 and the first insulating layer 408 are closed-shape and concentrically arranged in the first opening 404. A bottom 406c of the first conductive layer 406 and a bottom 408c of the first insulating layer 408 are positioned on the first bottom 404b of the first opening 404. Sidewall deposition of the first conductive layer and the first insulating layer can be implemented by a selective deposition, an atomic layer deposition, or a conformal deposition followed by spacer open etches.

Figure 3C:
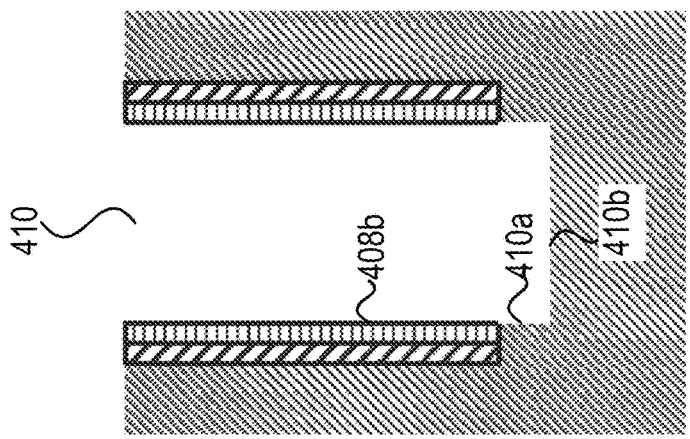
Figure 3F:
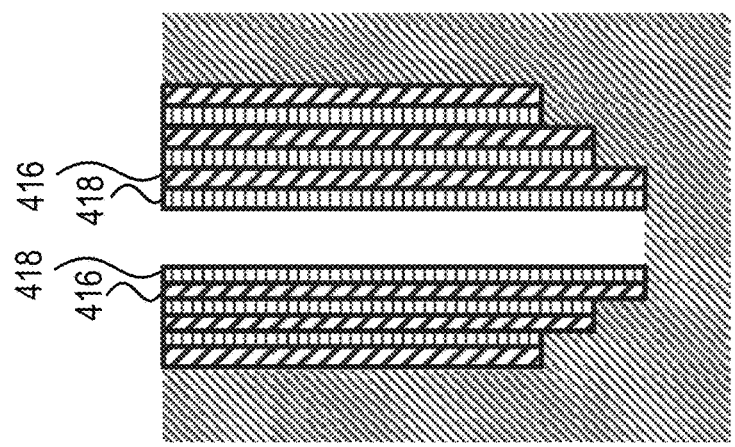
Figure 3E:
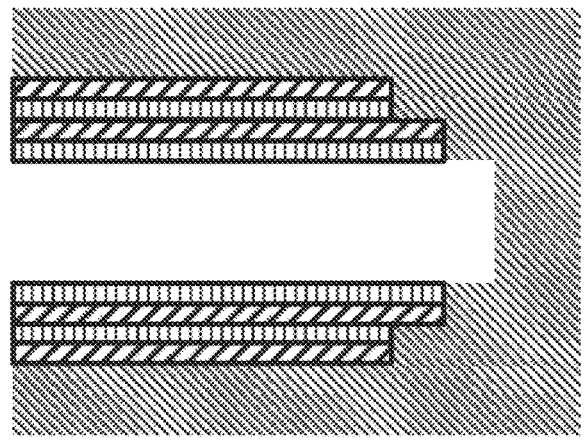
Figure 3D:
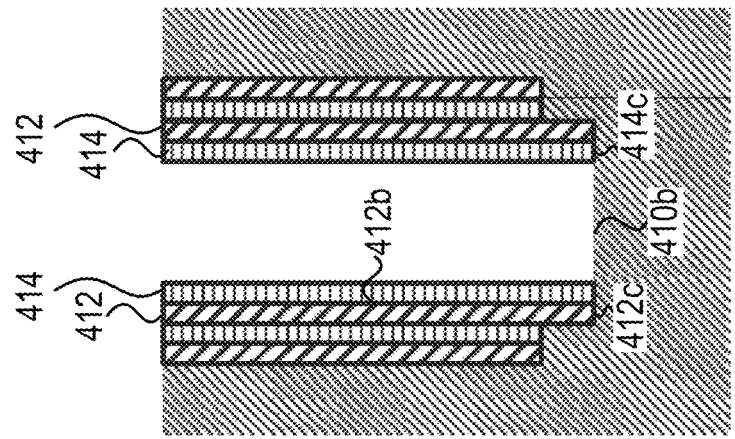
Figure 3H:
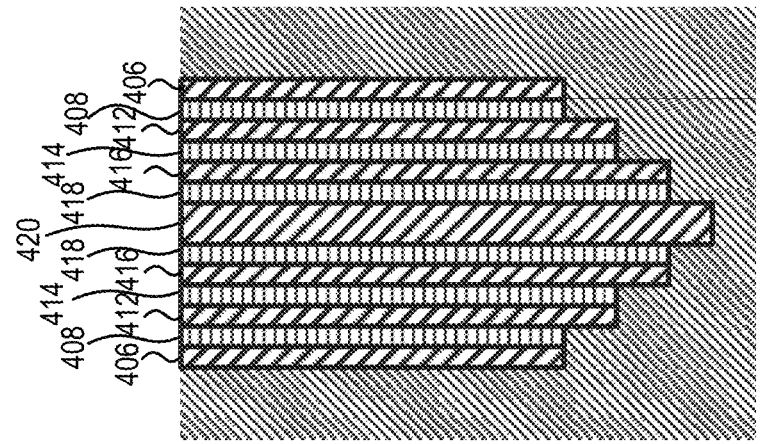
Figure 3G:
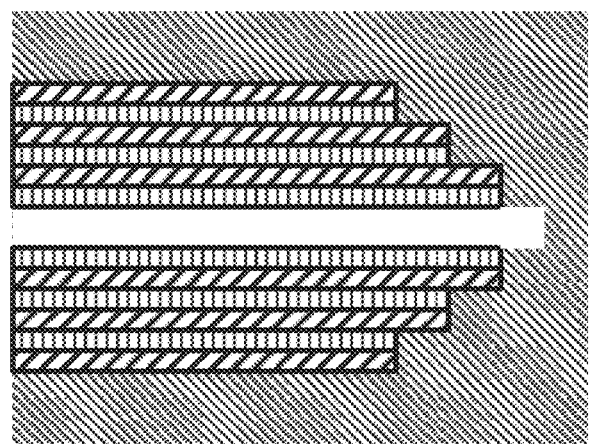

In FIG. 3C, the sidewall formation of a conductor and insulator pair (e.g., the first conductive layer and the first insulating layer) is followed by a second vertical (directional) etch. Note that the conductor and insulator pair masks (or protects) a portion of the bottom of the first opening 404 so that additional bulk material (e.g., underlying material with respect to the first opening in the dielectric stack 402) that is etched is narrower than the initial first opening that was etched, forming a step-shaped etch progression of the underlying material. As shown in FIG. 3C, the second etch can etch the dielectric stack 402 along an inner sidewall 408b of the first insulating layer 408 so as to form a second opening 410. The second opening 410 extends into the dielectric stack 402 and has a second sidewall 410a and a second bottom 410b. The second sidewall 410a is formed along the inner sidewall 408b of the first insulating layer 408 and further extends into the dielectric stack 402. The second bottom 410b of the second opening 410 is positioned below the bottoms 406c and 408c of the first conductive layer 406 and first insulating layer 408.

These process steps are repeated until all concentric layers are built-up (FIGS. 3D-3H). For example, in FIG. 3D a second conductive layer 412 is formed along the second sidewall 410a of the second opening 410 and a second insulating layer 414 is formed along an inner sidewall 412b of the second conductive layer 412. A bottom 412c of the second conductive layer 412 and a bottom of 414c the second insulating layer 414 are positioned on the second bottom 410b of the second opening 410 so that the bottom of the second conductive layer is positioned below the bottom of the first conductive layer to form a staggered configuration.

In FIGS. 3E-3H, alternately etching the dielectric stack and depositing a conductive layer and an insulating layer sequentially can be performed. Each deposition and etch operation can be cycled through sequentially without needed additional lithography exposures. Accordingly, a plurality of conductive layers (e.g., 406, 412, 416, and 420) and a plurality of insulating layers (e.g., 408, 414, and 418) are formed in the dielectric stack 402 to meet a predefined number of conductive layers and a predefined depth. The conductive layers and the insulating layers are positioned alternately with a closed-shape and concentrically arranged in the dielectric stack 402. The first conductive layer 406 is an outermost layer of the conductive layers. The conductive layers have bottom ends. The bottom ends are staggered and can be coupled to one or more of the local interconnects (e.g., 324-330 in FIG. 2) or one or more of the gate electrodes based on circuit designs.

In the example illustrated in FIG. 3A-3H, four conductive structures (also referred to as conductive layers) are formed and three insulator structures (also referred to as insulating layers) are formed. Note in FIG. 3H that a coaxial contact structure is formed with a tapered line-end or the coaxial contact structure ends at a tapered bottom-end. This staggered or step-shaped end enables electrical contact to different levels (e.g., local interconnects) or lines. This is a simplified example and simplified figures for clarity. In example embodiments, a coaxial contact structure herein can be built into a pre-existing stack of conductive films such as the local-interconnect levels (e.g., the local interconnects 324-330) shown in FIG. 2.

In some embodiments, the conductive layers can include tungsten, cobalt, copper, ruthenium, aluminum, or other suitable conductive materials. The insulating layers can include SiO, SiN, SiCN, SiC, or other suitable dielectric materials. Any suitable deposition method can be applied to form the conductive layers and the insulating layers, such as chemical vapor deposition (CVD), physical vapor deposition (PVD), diffusion, and atomic layer deposition (ALD).

Figures 4A, 4B, 4C:
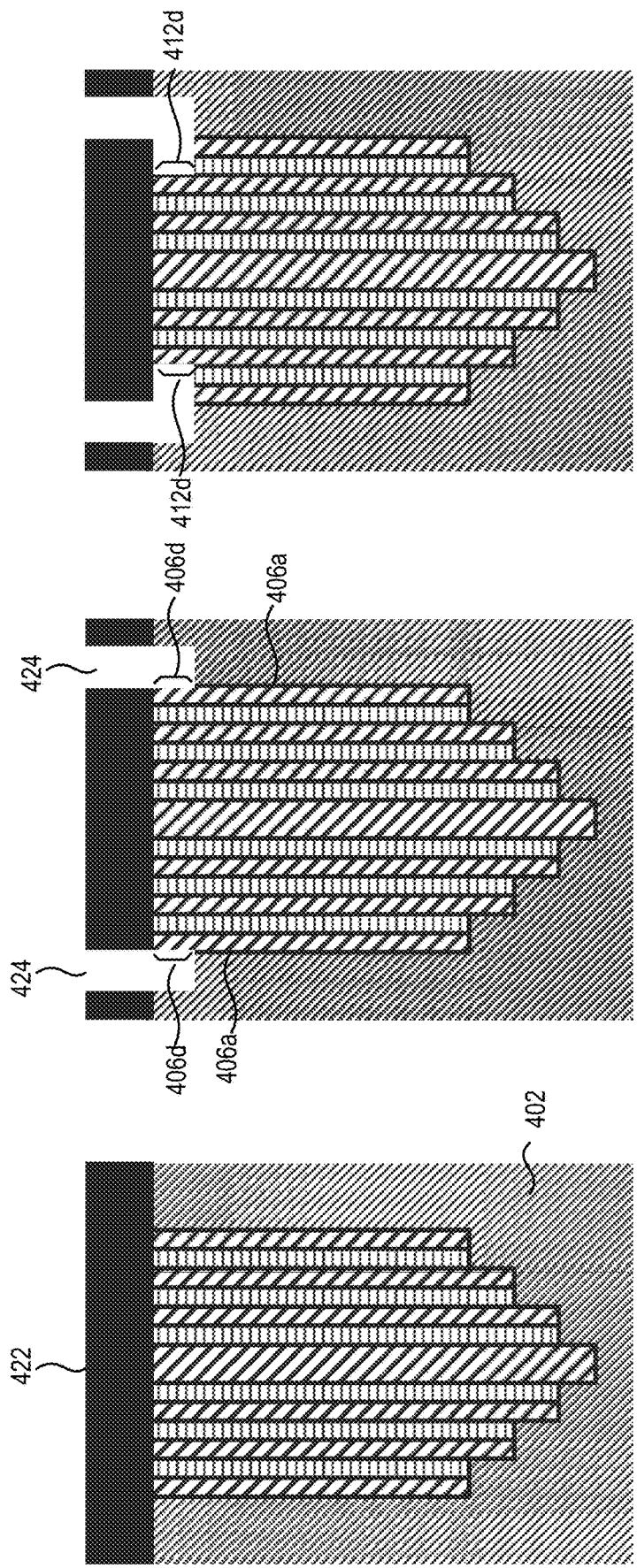
FIGS. 4A-4I are schematic views of second exemplary intermediate steps of manufacturing an exemplary coaxial contact, in accordance with some embodiments.

FIGS. 4A-4I are cross-sections of substrate segments illustrating formation of line-end extensions on a top level (top end) of the coaxial contact structure herein. Continuing from FIG. 3H, in FIG. 4A, a dielectric capping layer 422 is deposited on the conductive layers (e.g., 406, 412, 416, and 420), the insulating layers (e.g., 408, 414, and 418), and the dielectric stack 402. The dielectric capping layer (also referred to as capping layer) 422 can provide additional etch selectivity such that the bulk dielectric (e.g., the dielectric stack 402 that can be made of nitride) can be etched selectively to both the coaxial insulator (also referred to as insulating layer that can be made of oxide) and conductor (also referred to conductive layer) without affecting the dielectric capping layer 422. In some embodiments, the capping layer can be made of one of carbide, SiN, SiC, SiCN or other suitable dielectric materials. In FIG. 4B, a lithographically defined first vertical etch is then executed into the dielectric stack 402 surrounding the coaxial contact structure that is formed in FIG. 3H. The first vertical etch can be an anisotropic etch and can be selective to the conductor (or conductive layer) and coaxial insulators (or insulating layers) so as to only etch the surrounding dielectric of the coaxial contact structure or bulk material in the dielectric stack. As shown in FIG. 4B, the first vertical etch is performed into the dielectric stack to form a vertical trench opening 424 around an outer sidewall 406a of the first conductive layer 406. The vertical trench opening 424 extends into the dielectric stack 402 with a first depth and exposes a first portion 406d of the first conductive layer 406.

The initial vertical etch (or first vertical etch) can then be followed by a first isotropic etch (or a first lateral etch) into an outer pair of conductor and insulator (e.g., the first conductive layer 406 and the first insulating layer 408), shown in FIG. 4C. In FIG. 4C, the first lateral etch removes the uncovered first portion 406d of the first conductive layer 406 and a first portion of the first insulating layer 408 that is adjacent to the uncovered first portion 406d of the first conductive layer. The first lateral etch further exposes a first portion 412d of the second conductive layer 412.

Figure 4F:
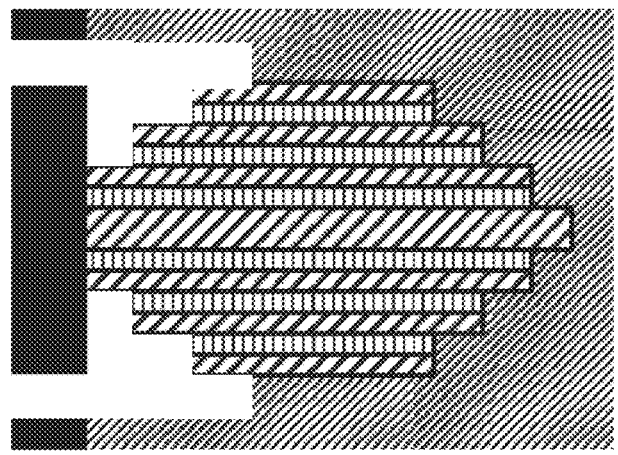
Figure 4E:
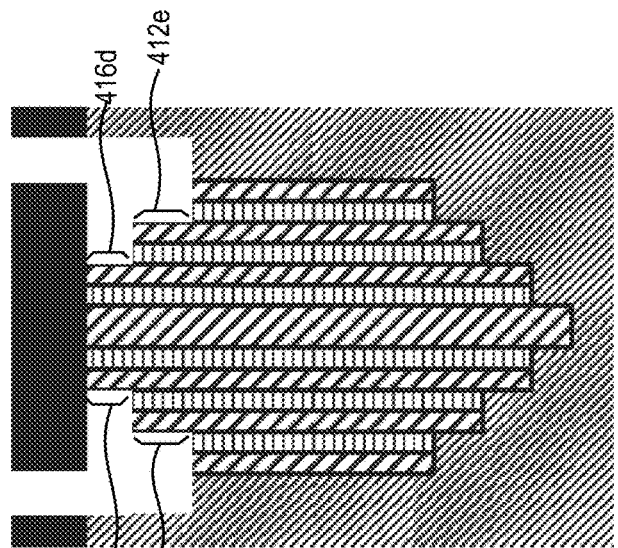
Figure 4D:
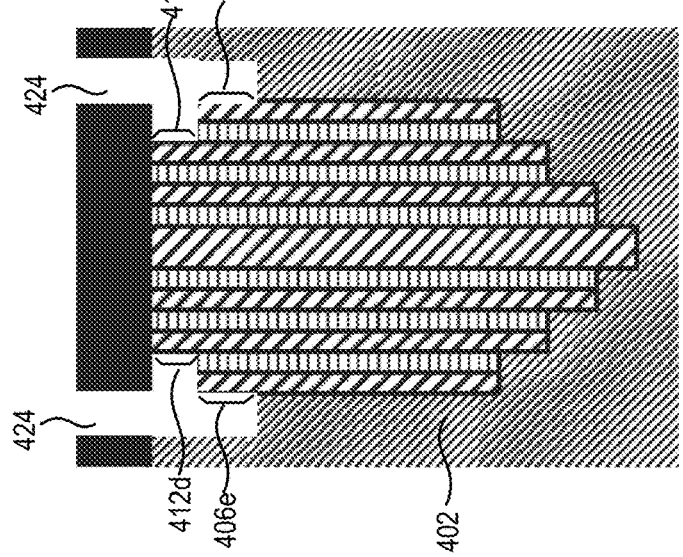

In FIG. 4D, a second vertical etch is performed into the dielectric stack 402 to extend the vertical trench opening 424 into the dielectric stack 402 with a second depth and expose (or uncover) a second portion 406e of the first conductive layer 406. The second depth is greater than the first depth.

In FIG. 4E, a second lateral etch can be performed. The second lateral etch can remove the exposed (or uncovered) second portion 406e of the first conductive layer 406 and a second portion of the first insulating layer 408 that is adjacent to the exposed second portion 406e of the first conductive layer, so as to expose a second portion 412e of the second conductive layer 412. The second lateral etch can further remove the exposed first portion 412d of the second conductive layer 412 and a first portion of the second insulating layer that is adjacent to the exposed first portion 412d of the second conductive layer 412, so as to expose a first portion 416d of a third conductive layer 416 of the conductive layers. As mentioned above in FIG. 2, the third conductive layer 416 is formed along an inner sidewall of the second insulating layer 414.

Figure 4I:
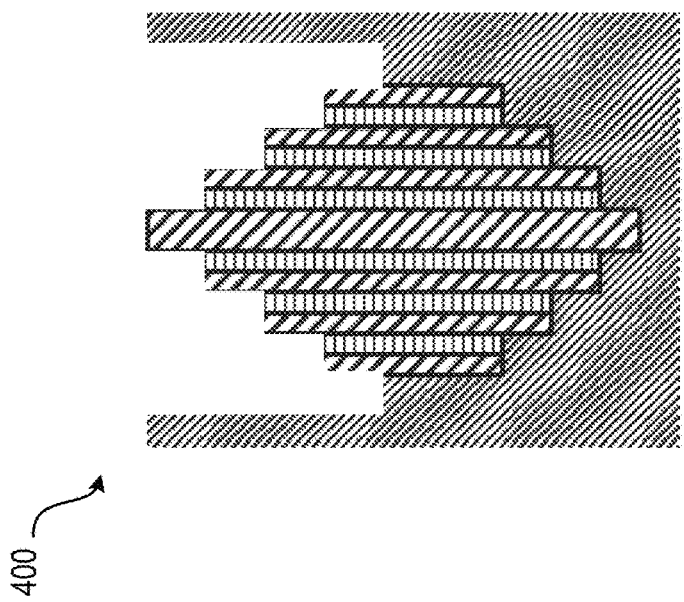
Figure 4H:
Figure 4G:
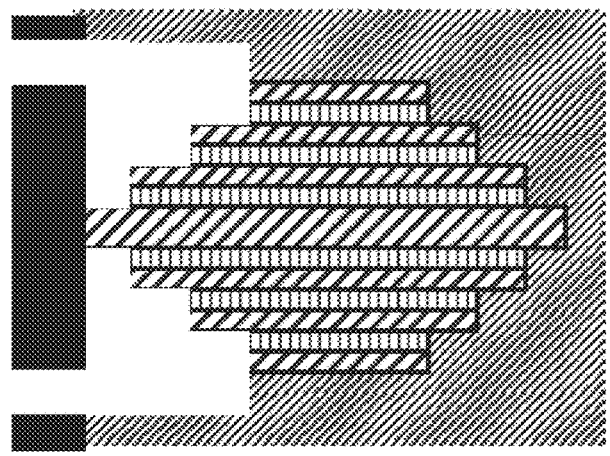

In FIGS. 4F-4H, the process sequence of vertical etch into surrounding material of the coaxial contact structure followed by conductor-insulator pair lateral etch is repeated until all conductive layers are exposed (uncovered) and can be connected to wires (e.g., metal layers 316-322 in FIG. 2) that are formed by conventional damascene or etch processes. The final step can be to remove the dielectric capping layer 422 as shown in FIG. 4I. Note that a result is that each coaxial conductor (or conductive layer) has a different height to enable wire connections at different metal levels, thereby providing self-alignment of contacts also. After the removal of the dielectric capping layer 422, a coaxial contact 400 can be formed in FIG. 4I. The coaxial contact 400 can have a similar configuration to the coaxial contact 300 in FIG. 2.

Figure 5A:
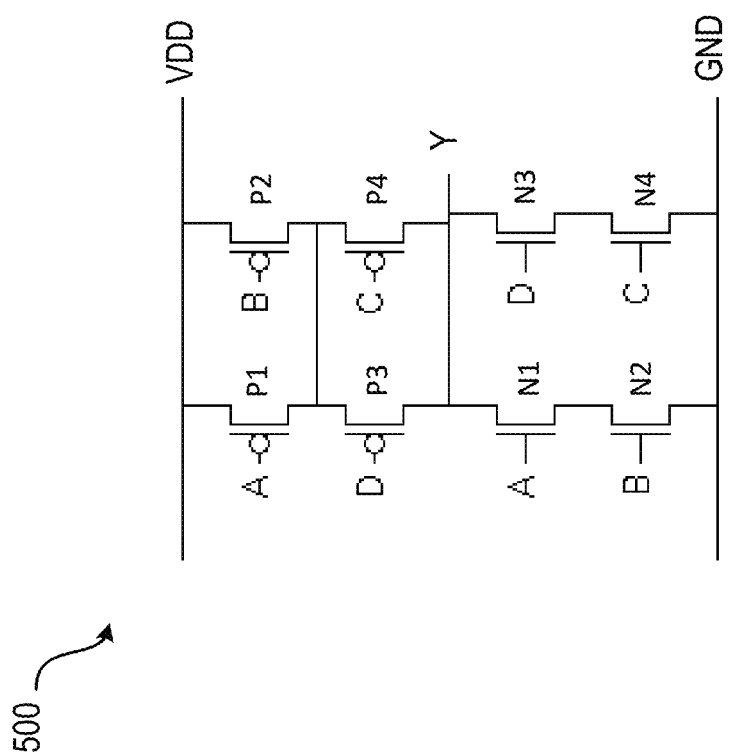
FIG. 5A is a schematic circuit diagram of an And-Or-Invert 22 (AOI22) cell, in accordance with some embodiments.
Figure 5B:
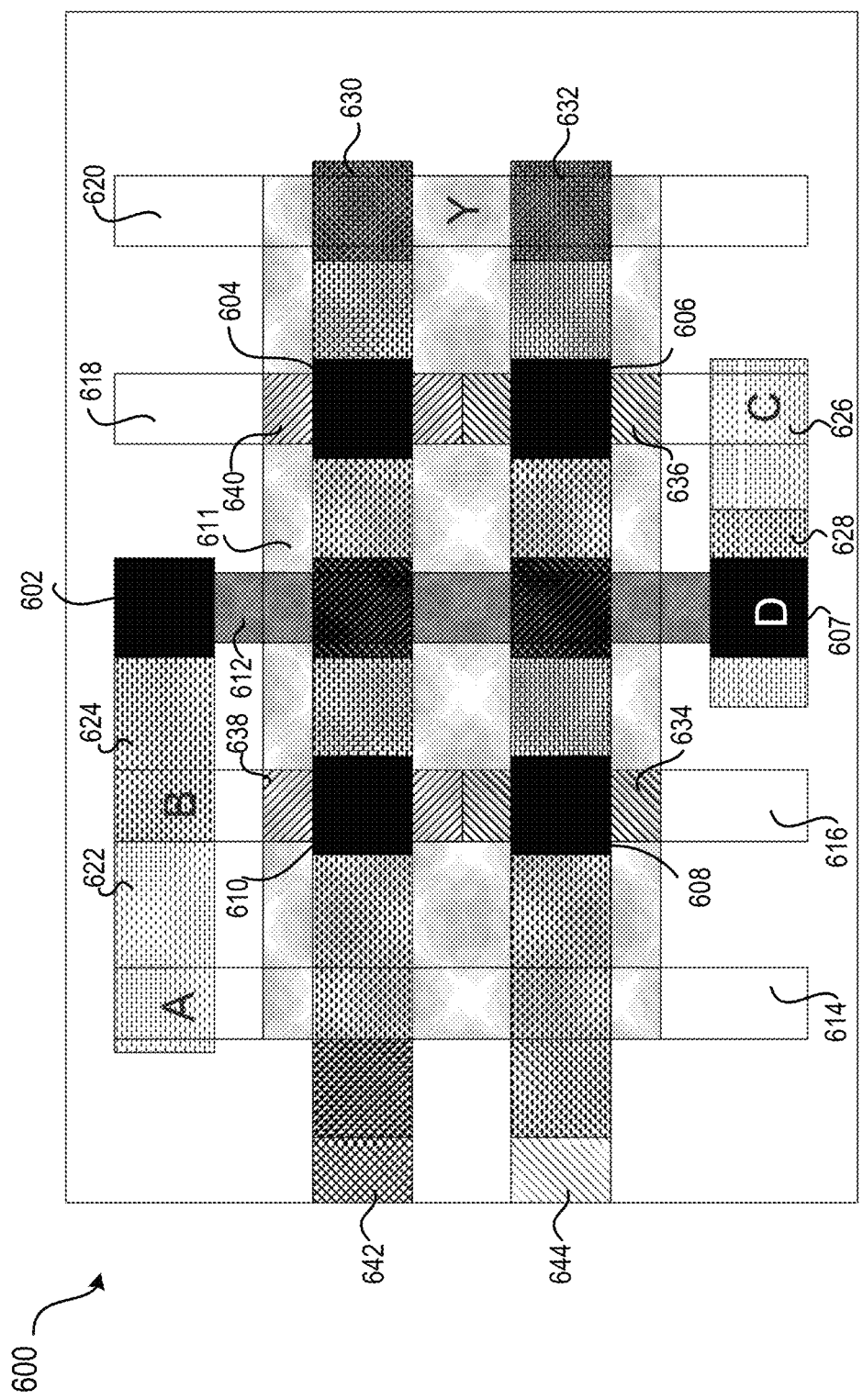
FIG. 5B is a top down layout view of an AOI22 cell implemented based on a CFET stack and coaxial contacts, in accordance with some embodiments.

FIGS. 5A and 5B illustrate how the coaxial contact structure herein can be used to build very compact 3D integrated logic layouts. FIG. 5A is a schematic circuit diagram of an And-Or-Invert 22 (AOI22) cell 500. The AOI cell 500 herein is a moderately complex standard cell with transistors that are grouped in parallel pairs on a p-fet side of the cell and serial pairs on a n-fet side of the cell. For example, the p-fet side can includes four p-type transistors P1-P4, where P1 and P2 are connected in parallel, and P3 and P4 are connected in parallel. The n-fet side can includes four n-type transistors N1-N4, where N1 and N2 are serially connected and N3 and N4 are serially connected. The AOI cell (or AOI22 cell) 500 is electrically coupled to four inputs A-D and an output Y. Each of the four inputs A-D is coupled to a respective n-type gate and p-type gate of the AOI cell 500. For example, the input A is coupled to a n-type gate of n-type transistor N1 and a p-type gate of p-type transistor P1. In addition. The AOI cell 500 is connected to a supply voltage VDD that are coupled to source regions of the p-type transistors P1 and P2. The AOI cell 500 is further connected to a ground voltage GND that is coupled to source regions of the n-type transistors N2 and N4.

FIG. 5B is a top down layout view 600 of an AOI22 cell that is implemented based on a CFET stack and coaxial contacts, in accordance with some embodiments of the present disclosure. The layout view 600 can include a plurality of coaxial contacts 602-610, an active region 611 that has doped through an ion implantation process. In some embodiments, the coaxial contacts 608 and 610 can be source-side coax-contacts that are coupled to source regions of the CFET stack, the coaxial contacts 604 and 606 can be drain-side coax-contacts that are coupled to drain regions of the CFET stack, and the coaxial contacts 602 and 607 can be gate coax-contacts that are coupled to gate electrodes of the CFET stack. The layout view 600 can have a poly gate 612 which is an overlap of several poly gates shown in FIGS. 6A-6D, a plurality of metal one (M1) layers 614-620 that are coupled to one or more inputs (e.g., inputs A-C) and an output (e.g., output Y). The layout view 600 can further have a plurality of metal zero (M0) layers 622-628, one or more interconnects (or vertical interconnects, or vertical output interconnects) 630-632, source-side/drain-side local interconnects (also referred to as source/drain local interconnects) 634-636 for n-type transistors of the CFET stack, source-side/drain-side local interconnects 638-640 for p-type transistors of the CFET stack, a power-rail connection 642 coupled to a supply voltage VDD and a power-rail connection 644 coupled to a ground voltage GND.

FIG. 5B shows an AOI22 (i.e. and-or invert) cell identifying some attributes that can be further described in FIGS. 6A-6D. The logic cell shown in FIG. 5B is 4 metal tracks tall and 3 poly tracks wide. Space left by a diffusion break, which can be left and right margins of the cell outside the active area/region, is used to connect to buried or conventional power-rails (not shown). Using a metal to poly pitch ratio of 2:1 leaves 5 tracks for metal to form four inputs (e.g., A-D) and one output (e.g., Y) pin. A manner of connecting coaxial contacts with these pins to a 3D stack of active devices is illustrated in FIGS. 6A-6D. Also illustrated in FIGS. 6A-6D is a manner in which source and drain connections are formed to render desired or designed logic functions.

FIGS. 6A-6D use four cross-section cut-lines, one for each of the metal tracks, to illustrate how the coaxial contact is used to form very compact logic cells and to show the highly efficient and ultra-regular unidirectional local wiring layout configurations which the coaxial contact enables. To be able to put specific connection points into context, a top-down layout view 600 of the AOI22 cell, as shown in FIG. 5B, is repeated in FIGS. 6A-6D with a location of respective coax contacts highlighted. In general, the coaxial contacts provide an area efficient connection between a stack of generic devices and a stack of local wiring which functionalizes each cell with a high degree of patterning and process efficiency.

Figure 6A:
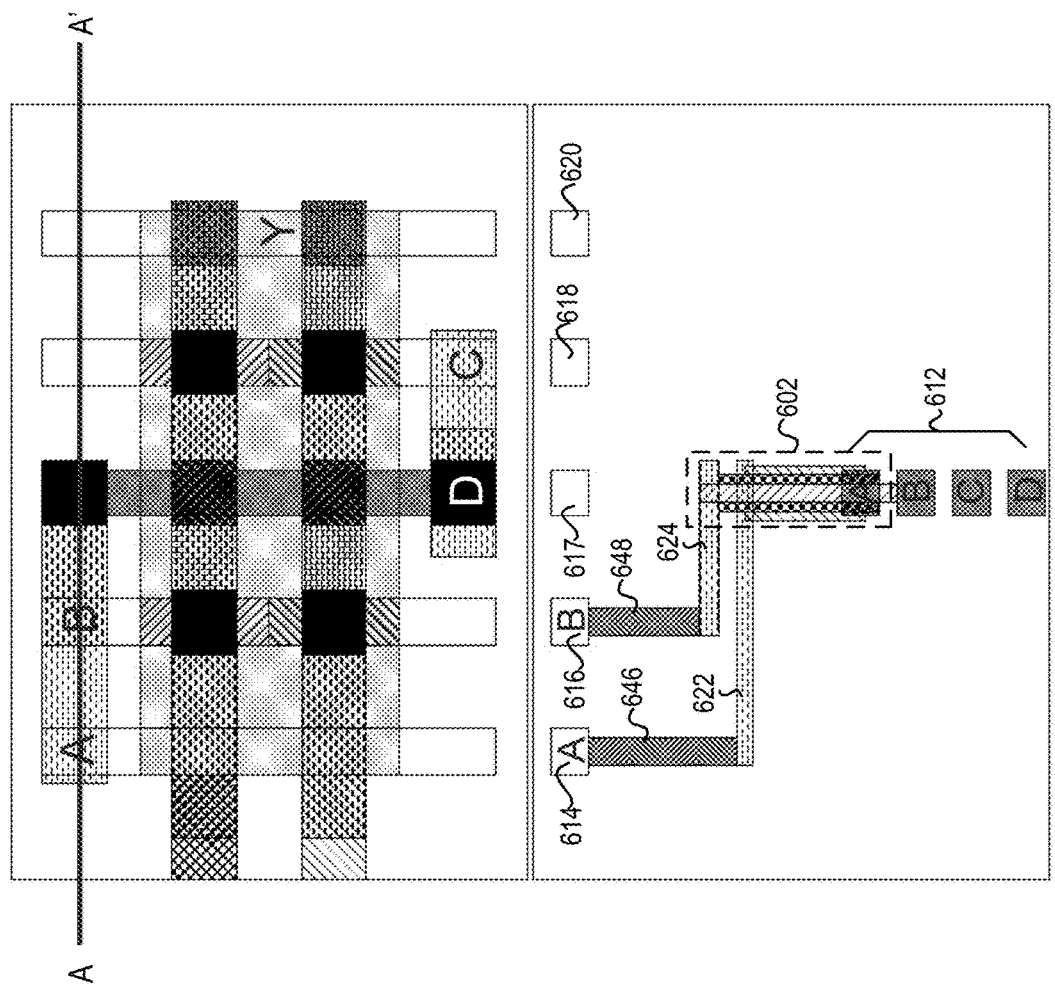
FIG. 6A is a first cross-sectional layout view of an AOI22 cell implemented based on a CFET stack and coaxial contacts, in accordance with some embodiments.

In FIG. 6A, a connection from input pins A and B to a corresponding poly gate is shown. The top portion of FIG. 6A is the layout view 600 of the AOI22 cell, and the bottom portion of FIG. 6A is a cross-sectional view that is obtained from a line A-A' perpendicular to a top surface of the layout view 600. Input pins (labeled A and B) can be M1 level and applied with corresponding inputs (e.g., A-D). In FIG. 6A, input pin A (i.e., 614) and input pin B (i.e., 616) connect through conventional vertical interconnects (e.g., vias) 646 and 648 to a corresponding lower level of metal, such as M0 level 622 and 624 respectively. The vertical interconnects 646 and 648 can also be referred to as inter-level connection points. For example, the input pin A 614 is connected to M0 level (or M0 layer) 622 through the vertical interconnect 646. The two levels of M0 (e.g., 622 and 624) then connect to the two concentric tubes of conductor (or conductive layers) in the coaxial contact 602. Accordingly, input pin A connections to an outer conductor (outer conductive layer), while input pin B connects to an inner conductor of the coaxial contact 602. Further, the outer conductor is coupled to the poly gate A and the inner conductor is coupled to the poly gate B respectively. Therefore, the design in FIG. 6A provides an area-efficient connection between the input pins and gate levels A and B.

Figure 6B:
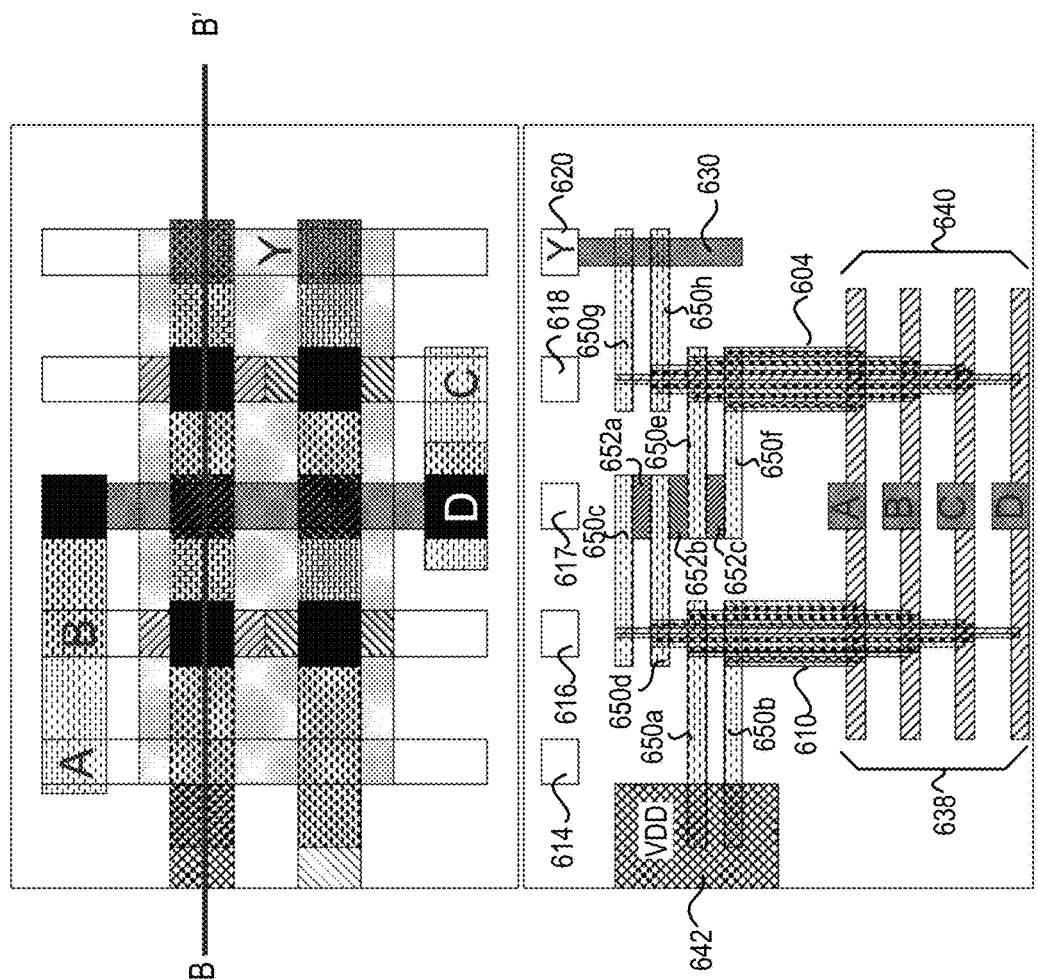
FIG. 6B is a second cross-sectional layout view of an AOI22 cell implemented based on a CFET stack and coaxial contacts, in accordance with some embodiments.

FIG. 6B illustrates power, internal wiring, and output signal connections to p-type devices. The top portion of FIG. 6B is the layout view 600 of the AOI22 cell, and the bottom portion of FIG. 6B is a cross-sectional view that is obtained from a line B-B' perpendicular to the top surface of the layout view 600. Power (or supply voltage) VDD enters devices from the power-rail connection 642 appearing on the left side of the cross section through lower two M0 levels 650a-650b. Power VDD connections are strapped to outer two conductive layers in the coaxial contact 610 and routed to the source-side local interconnects 638 for gates A and B. After running through gates A and B in parallel (as called for on the p side of the schematic), the output is picked up by the drain-side local interconnects 640 for gates A and B. The output is then picked up by the coaxial contact 604 and then is routed to the bottom two M0 levels 650e-650f. The two M0 levels 650e-650f are further connected to the top two M0 levels 650c-650d through one or more vertical interconnects (or inter-level connection points) 652a-652c. Moving the signal (e.g., power VDD) from the bottom two M0 levels 650e-650f to the top two M0 levels 650c-650d allows the signal to be fed into the inner two conductive layers of the coaxial contact 610. The inner two conductive layers of the coaxial contact 610 are coupled to the source-side local interconnects 638 for gates C and D to provide input to gates C and D. The outputs of gates C and D in turn are picked up by the drain-side local interconnects 640, and further picked up by two inner conductive layers of the coaxial contact 604. The outputs are further routed by the two inner conductive layers of the coaxial contact 604 to two top M0 levels 650g-650h, and further are fed to the output pin Y (e.g., 620). It should be noted that the two top M0 levels 650g-650h are coupled to the output pin Y through interconnects 630.

FIG. 6C illustrates power, internal wiring, and output signal connections to n-type devices. The top portion of FIG. 6C is the layout view 600 of the AOI22 cell, and the bottom portion of FIG. 6C is a cross-sectional view that is obtained from a line C-C' perpendicular to the top surface of the layout view 600. Power enters from GND power-rail connection 644 through second and third M0 levels 654a-654b. The second and third M0 levels 654a-654b connect the power-rail connection 644 to the source-side local interconnects 634 for gates C and B through the coaxial contact 608. After running through gates C and B, output is picked up by the drain-side local interconnects 636 for gates C and B. The output is then fed by coaxial contact 606 that is connected with the drain-side local interconnects 636 to 2nd and 3rd M0 levels 654e-654f. The 2nd and 3rd M0 levels 654e-654f are further strapped to the top and bottom M0 levels 654c and 654d through vertical interconnects (also referred to as inter-level connection points) 656a-656b respectively. The top and bottom M0 levels 654c and 654d are then connected to the source-side local interconnects 634 for gates A and D through the coaxial contact 608 and the output accordingly becomes an input to gates A and D. An output of gates A and D is then picked up by the drain-side local interconnects 636 for gates A and D, and further picked up by the outer and inner most conductive layers of the coaxial contact 606 that are connected with the drain-side local interconnects 636. The coaxial contact 606 routes the output of gates A and D to the top and bottom M0 levels 654g and 654h. The top and bottom M0 levels 654g and 654h further route the output of gates A and D to the output pin Y (e.g., 620), where the top and bottom M0 levels 654g and 654h are coupled to the output pin Y through the interconnect 632.

Figure 6D:
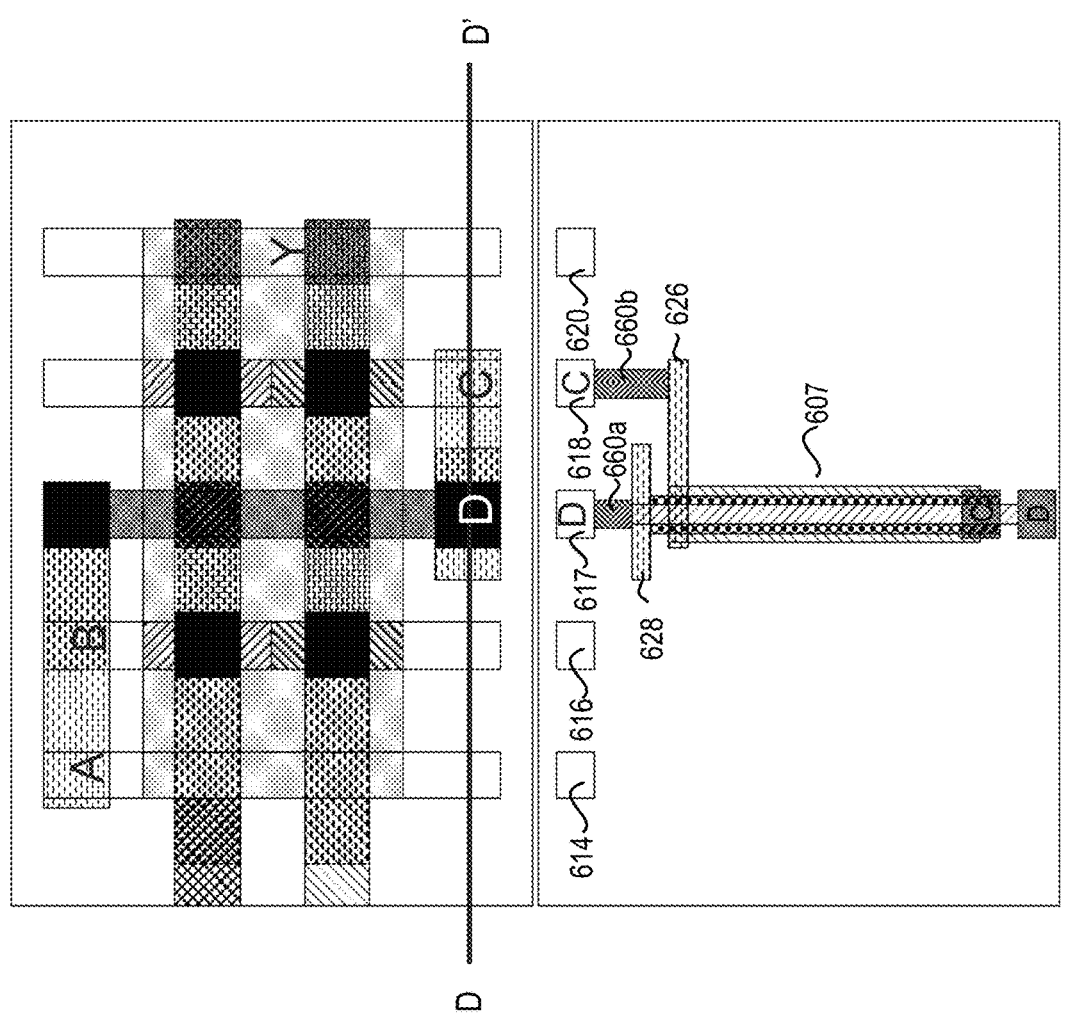
FIG. 6D is a fourth cross-sectional layout view of an AOI22 cell implemented based on a CFET stack and coaxial contacts, in accordance with some embodiments.

FIG. 6D illustrates configuration and functionality similar to FIG. 6A. The top portion of FIG. 6D is the layout view 600 of the AOI22 cell, and the bottom portion of FIG. 6D is a cross-sectional view that is obtained from a line D-D' perpendicular to a top surface of the layout view 600. Similar to FIG. 6A, signal connections to gates C and D through the coaxial contact 607, where an outer conductor of the coaxial contact 607 connects the bottom M0 layer 626 to the gate C, and a center conductor (or conductive layer) of the coaxial contact 607 connects the top-most M0 628 to the bottom-most gate D. As shown in FIG. 6D, input pins (labeled C and D) 617-618 can be M1 level (or M1 layer) and applied with corresponding inputs (e.g., C and D). The input pin C 618 and input pin D 617 connect through conventional vertical interconnects 660a and 660b to corresponding lower level of metal M0 628 and 626 respectively. For example, the input pin C 618 is connected to M0 628 through the vertical interconnect 660a. The two levels of M0 (e.g., 626 and 628) then connect to the two concentric tubes of conductor (or conductive layers) in the coaxial contact 607. Accordingly, input pin C 618 connects to an outer conductor (outer conductive layer), while input pin D 617 connects to an inner conductor of the coaxial contact 607. Further, the outer conductor is coupled to the poly gate D and the inner conductor is coupled to the poly gate C respectively. Therefore, the design in FIG. 6D provides an area-efficient connection between the input pins and gate levels C and D.

Accordingly technique herein includes methods of fabrication and semiconductor device structures. One embodiment includes a vertical interconnect structure. The vertical interconnect structure comprises multiple concentric conductive layers separated by insulators (or insulating layers). The interconnect structure has staggered ends (line ends or structure ends), that is, step-shaped ends. Such staggering facilitates selective connectivity to subsequent conductive layers (e.g., source-side or drain-side local interconnect) in a stack.

Another embodiment includes a microfabrication process to form bottom line-end extensions. The process includes a first etch that is a directional (anisotropic) etch to define an opening/hole in a first dielectric material. The first etch forms the opening sufficient for a radius of a coaxial contact structure, but at a partial depth of a final coaxial contact structure. The depth can be equivalent to a depth of an outer conductor (or conductive layer) of the coaxial contact structure to be formed. Depositing a first conductor on sidewalls of the opening, and depositing a first insulator (or insulating layer) on uncovered sidewalls of the first conductor. Executing a second etch (directional) that removes portions of the first dielectric material not covered by the first conductor and the first insulator. The second etch etching a predetermined distance into the first dielectric. Depositing a second conductor on sidewalls of the first insulator and uncovered sidewall portions of the opening. Depositing a second insulator on uncovered sidewalls of the second conductor. Filling space remaining in the defined opening with a third conductor. Note that additional conductor and insulator pairs can be added prior to filling remaining space with the third conductor. The defined opening is further etched prior to each additional conductor and insulator pair, and the defined opening is further etched prior to a final fill (filling with third conductor).

Another embodiment includes a process for forming a top (vertical top) of a coaxial contact structure herein. The process begins with a coaxial contact structure having concentric formations of conductor and insulator pairs and having a planar top surface. The bottom of the coaxial contact structure can be step-shaped with a central conductor extending deeper compared to an outer conductor. The coaxial contact structure is surrounded by a first dielectric material. A first etch (or a directional etch, a vertical etch) is executed into the first dielectric material surrounding the coaxial contact structure. The first etch can etch to a predetermined depth, such as a vertical depth of one lateral wiring and dielectric layer. Next, as second etch is executed that is a lateral etch into an outermost coaxial conductor and insulator pair. A third etch is executed that is a vertical etch into the first dielectric surrounding the coaxial contact structure to a depth of an additional lateral wiring and dielectric layer. A fourth etch is execute that is a lateral etch into each uncovered conductor and insulator pair, resulting in a step-shaped geometry of a top end of the coaxial contact structure. This sequence of vertical etch into surrounding dielectric followed by lateral/horizontal etching of uncovered conductor and dielectric pairs is executed until uncovering a central conductor of the coaxial contact structure. In addition to the central conductor, the coaxial contact structure can include one or more conductor and insulator cylindrical pairs.

Another embodiment includes a device design or configuration. Such a design, for example, can be used as a standard cell architecture (e.g., a AOI22 cell) or part of a standard cell architecture. Such a device can include a power-rail connection (e.g., 642 and 644 in FIG. 5B). The power-rail connection can be positioned in a space left by a diffusion break on one vertical cell boundary (referred to herein as a "source-side" of a cell). The power-rail connection is split between VDD (high voltage, also referred to as 1) over p-devices (or p-type transistors), and GND (low voltage, also referred to as 0) over the n-devices (or n-type transistors). The power-rail connection generically extends over an entire height of the local wiring (M0) stack, allowing functionalization solely by connecting the appropriate M0 levels.

A vertical interconnect (or vertical output interconnect) (e.g., 630, 632 in FIG. 5B) is positioned on an opposite side of the cell (referred to herein as the "drain-side" of the cell) connecting both p-devices and n-devices to an output pin (e.g., 620 in FIG. 6B). The vertical interconnect is formed either as two separate connections of p and n regions of the cell or one continuous via-bar connecting both outputs simultaneously. The vertical output interconnect (e.g., 630 or 632 in FIG. 5B) generically extends over an entire height of the local wiring (M0) stack, allowing functionalization by connecting corresponding M0 levels.

A stack of local wiring (M0) levels (e.g., 654*a*-654*d* in FIG. 6C) is formed with one wiring level per device level in a 3D logic stack (i.e. stacking four transistors requires four levels of M0). Such M0 levels facilitate functionalization of the cell layout by forming four connections over both the p-device and n-device local interconnects (e.g., 638 and 640 in FIG. 6B, 634 and 636 in FIG. 6C). The connections made by M0 levels can include a power (e.g., VDD or GND) to a source-side coax-contact (e.g., 608 and 610), a drain-side coax-contact (e.g., 604 and 606) to an inter-level connection point (e.g., 652*a*-652*c* in FIG. 6B), an inter-level connection point (e.g., 656*b* in FIG. 6C) to a source-side coax-contact (e.g., 608), and a drain-side coax-contact (e.g., 606) to a vertical interconnect (e.g., 632) connected to output pin (e.g., 620). These M0 levels further connect the input pins (e.g., 614-618) of the cell to the appropriate transistor gates (e.g., poly gates A-D) through gate coax-contacts (e.g., 602, 607) on wiring tracks outside the active region (e.g., 611) of the cell/device.

In the present disclosure, a pair of gate coax-contacts (e.g., 602 and 607) is positioned, one over each outside wiring track, to connect stacked gates to the input pins. And two or more pairs of source/drain coax-contacts are formed, where one pair (e.g., 610 and 604) is positioned over the p-device source and drain, the other pair (e.g., 608 and 606) is positioned over the n-device source and drain.

Accordingly, techniques herein provide a compact and efficient method and structure for providing vertical connections within various semiconductor devices including 3D logic devices as well as memory devices such as static random access memory (SRAM) devices.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device formed over a substrate, comprising:
    conductive layers extending from local interconnects and coupled to metal layers that are stacked over the local interconnects, the local interconnects being stacked over the substrate and extending laterally along a top surface of the substrate, the metal layers extending laterally along the top surface of the substrate, the conductive layers being close-shaped, concentrically arranged, and extending in a pillar shape, each of the local interconnects being coupled to a corresponding conductive layer from the conductive layers, and each of the conductive layers being coupled to a corresponding metal layer from the metal layers; and
    insulating layers that are close-shaped, concentrically arranged, and positioned alternately with respect to the conductive layers so that the conductive layers are spaced apart from one another by the insulating layers.

2. The semiconductor device of claim 1, wherein the conductive layers have bottom ends, the bottom ends being staggered and coupled to one or more of the local interconnects so that each of the local interconnects is coupled to a respective conductive layer from the conductive layers.

3. The semiconductor device of claim 2, wherein the insulating layers have bottom ends, the bottom ends being staggered so that a bottom end of each of the insulating layers is level with a bottom end of a corresponding conductive layer from the conductive layers.

4. The semiconductor device of claim 1, wherein the conductive layers have top ends, the top ends being staggered and coupled to one or more of the metal layers so that each of the conductive layers is coupled to a respective metal layer from the metal layers.

5. The semiconductor device of claim 4, wherein the insulating layers have top ends, the top ends being staggered so that a top end of each of the insulating layers is level with a top end of a corresponding conductive layer from the conductive layers.

6. The semiconductor device of claim 1, wherein the conductive layers have at least one of a tube configuration, or a cylinder configuration.

7. The semiconductor device of claim 6, wherein the tube configuration or the cylinder configuration has a tapered profile.

8. The semiconductor device of claim 1, further comprising:
    transistor pairs that are stacked over the substrate, each of the transistor pairs including a n-type transistor and a p-type transistor that are stacked over one another, wherein:
        the n-type transistor has a source region and a drain region that are positioned at two ends of a n-type channel region of the n-type transistor, each of the source region and drain region of the n-type transistor being coupled to a respective local interconnect from the local interconnects, the n-type channel region being surrounded by a n-type gate structure, and
        the p-type transistor has a source region and a drain region that are positioned at two ends of a p-type channel region of the p-type transistor, each of the source region and drain region of the p-type transistor being coupled to a respective local interconnect from the local interconnects, the p-type channel region being surrounded by a p-type gate structure.

9. The semiconductor device of claim 8, further comprising:
    gate electrodes that are stacked over the substrate, the gate electrodes being electrically coupled to gate structures of the transistor pairs, wherein at least one of the conductive layers extends from one of the gate electrodes, and is coupled to the one of the gate electrodes.

10. A semiconductor device, comprising:
    transistor pairs that are stacked over a substrate, each of the transistor pairs including a n-type transistor and a p-type transistor that are stacked over one another, local interconnects being stacked over the substrate and extending along a top surface of the substrate, the local interconnects being electrically coupled to source regions and drain regions of the transistor pairs;
    metal layers stacked over the local interconnects;
    conductive layers extending from the local interconnects and coupled to the metal layers, the conductive layers being close-shaped, concentrically arranged, and extending in a pillar shape, each of the local interconnects being coupled to a corresponding conductive layer from the conductive layers, and each of the conductive layers being coupled to a corresponding metal layer from the metal layers; and
    insulating layers being close-shaped, concentrically arranged, and positioned alternately with respect to the conductive layers so that the conductive layers are spaced apart from one another by the insulating layers.

11. The semiconductor device of claim 10, wherein the conductive layers have bottom ends, the bottom ends being staggered and coupled to one or more of the local interconnects so that each of the local interconnects is coupled to a respective conductive layer from the conductive layers.

12. The semiconductor device of claim 10, wherein the conductive layers have top ends, the top ends being staggered and coupled to one or more of the metal layers so that each of the conductive layer is coupled to a respective metal layer from the metal layers.

13. The semiconductor device of claim 10, wherein the conductive layers have at least one of a tube configuration, or a cylinder configuration.

14. The semiconductor device of claim 10, further comprising:
    gate electrodes that are stacked over the substrate, the gate electrodes being electrically coupled to gate structures of the transistor pairs, wherein at least one of the conductive layers extends from one of the gate electrodes, and is coupled to the one of the gate electrodes.

* * * * *